United States Patent [19]

Janoska et al.

[11] Patent Number: 5,717,388
[45] Date of Patent: Feb. 10, 1998

[54] METHOD FOR LONG TERM MONITORING OF MAGNETIC FIELDS

[75] Inventors: Mark A. Janoska, Lawrenceville, N.J.; Paul S. Wong, Burnaby, Canada; Robert W. McCourt, Short Hills, N.J.

[73] Assignee: Public Service Electric and Gas Company, Newark, N.J.

[21] Appl. No.: 637,497

[22] Filed: Apr. 25, 1996

[51] Int. Cl.⁶ .................................. G08B 21/00
[52] U.S. Cl. ..................... 340/870.16; 340/870.07; 340/870.16; 340/657; 340/664; 324/117 R; 324/127
[58] Field of Search .................... 324/126, 127, 324/117 R, 260; 340/870.07, 870.16, 870.17, 657, 658, 664

[56] References Cited

U.S. PATENT DOCUMENTS

| | | | |
|---|---|---|---|
| 4,829,298 | 5/1989 | Fernandes | 340/870.16 |
| 5,300,924 | 4/1994 | McEachern et al. | 340/658 |
| 5,434,501 | 7/1995 | Esman et al. | 324/117 R |
| 5,438,256 | 8/1995 | Thuries et al. | 324/127 |
| 5,550,476 | 8/1996 | Lau et al. | 324/127 |
| 5,565,783 | 10/1996 | Lau et al. | 324/127 |

Primary Examiner—Jeffrey A. Hofsass
Assistant Examiner—Timothy Edwards, Jr.
Attorney, Agent, or Firm—W. Patrick Quast, Esq.

[57] ABSTRACT

There is disclosed a methodology for measuring the magnetic field strengths of fundamental and harmonic frequencies associated with a.c. electrical current flows over a protracted period of time; and, particularly, in hostile environments. A preferable application calls for the determination of the field strengths associated with electrical currents flowing in a.c. power, distribution lines of utilities. The monitoring instrument is positioned in relation to the power lines to be monitored, typically at the base of a pole immediately adjacent the pole of the power line or on a power line supporting pole itself. In order to provide for long term, powering of the monitoring device, d.c. power is developed utilizing the a.c. power that is present. The conversion from a.c. to d.c. is effected at a distance sufficiently far from the monitoring instrument so as not to have any consequence on the readings that are being taken. Readings during the protracted period are typically stored and then accessable at pre-determined periods. A procedure for checking operability of the instrument is disclosed. The methodology further includes a technique for determining the lateral profile of magnetic field strengths for transverse distances from the location site of the monitoring instrument. The methodology disclosed has broad application including workplace monitoring.

9 Claims, 14 Drawing Sheets

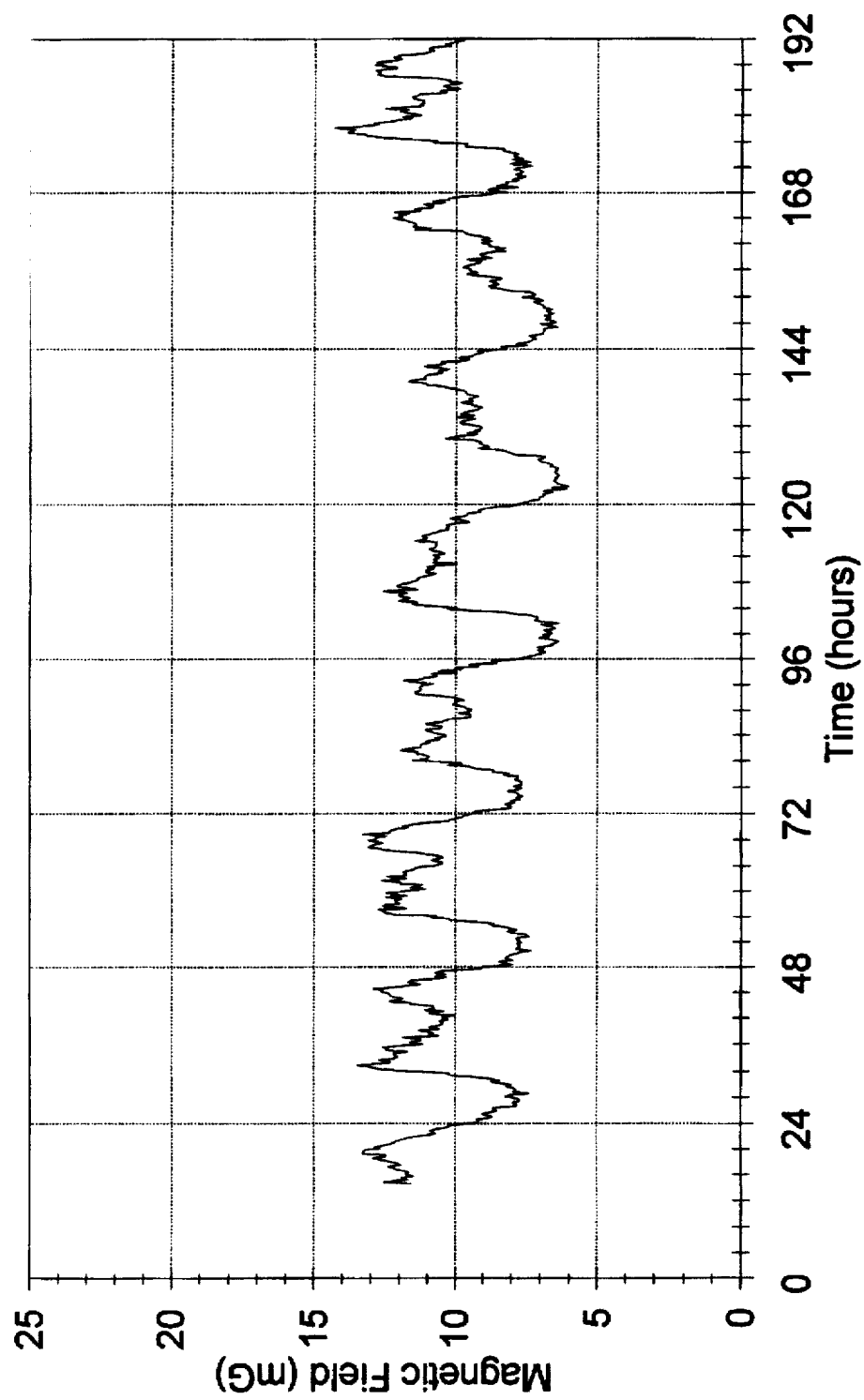
Fig. 4 Site 2 - Magnetic Field Levels
Typical Weekly Variations

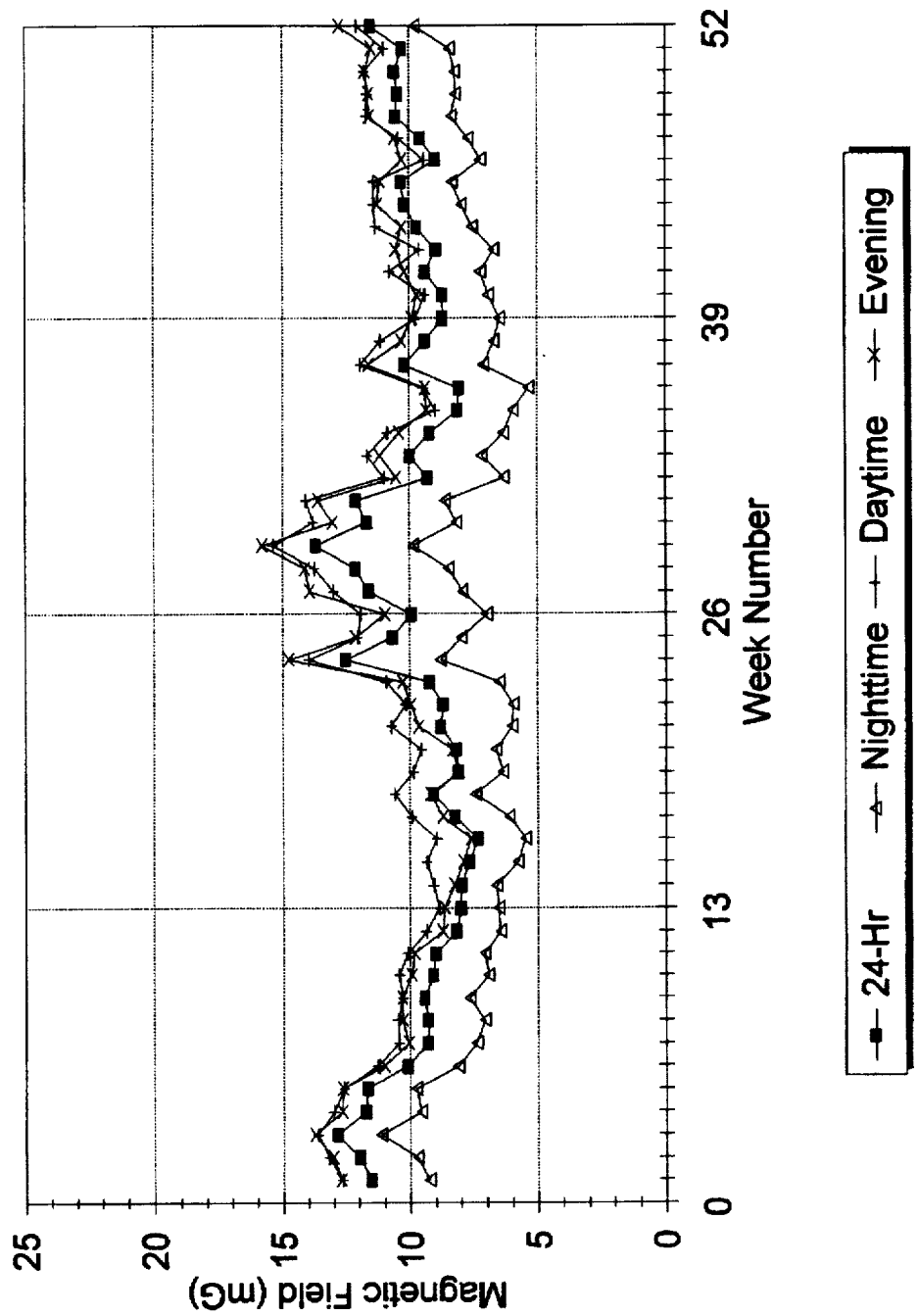

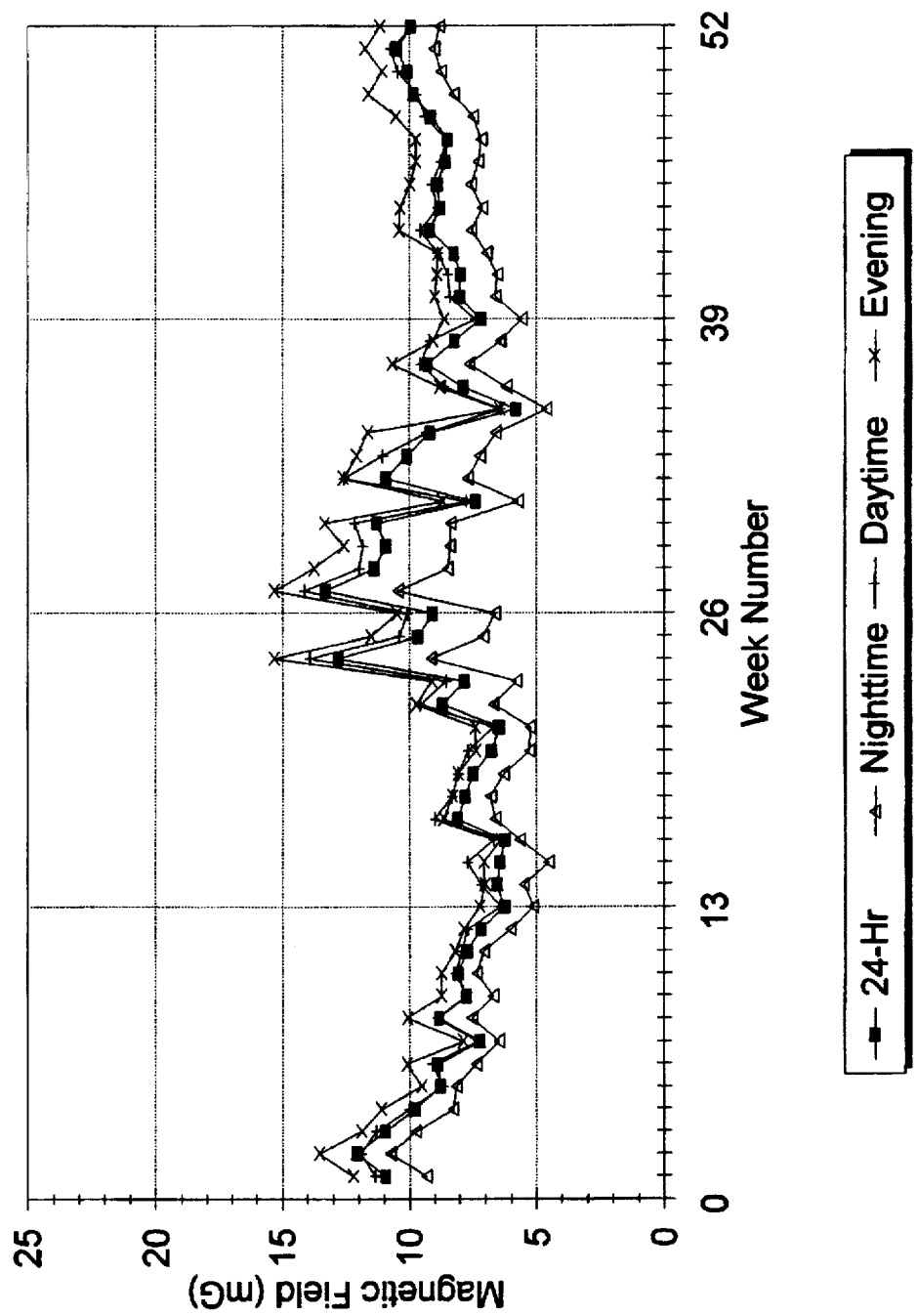
Fig. 6 Site 2 - Magnetic Field Levels
Average Means - Weekend Data

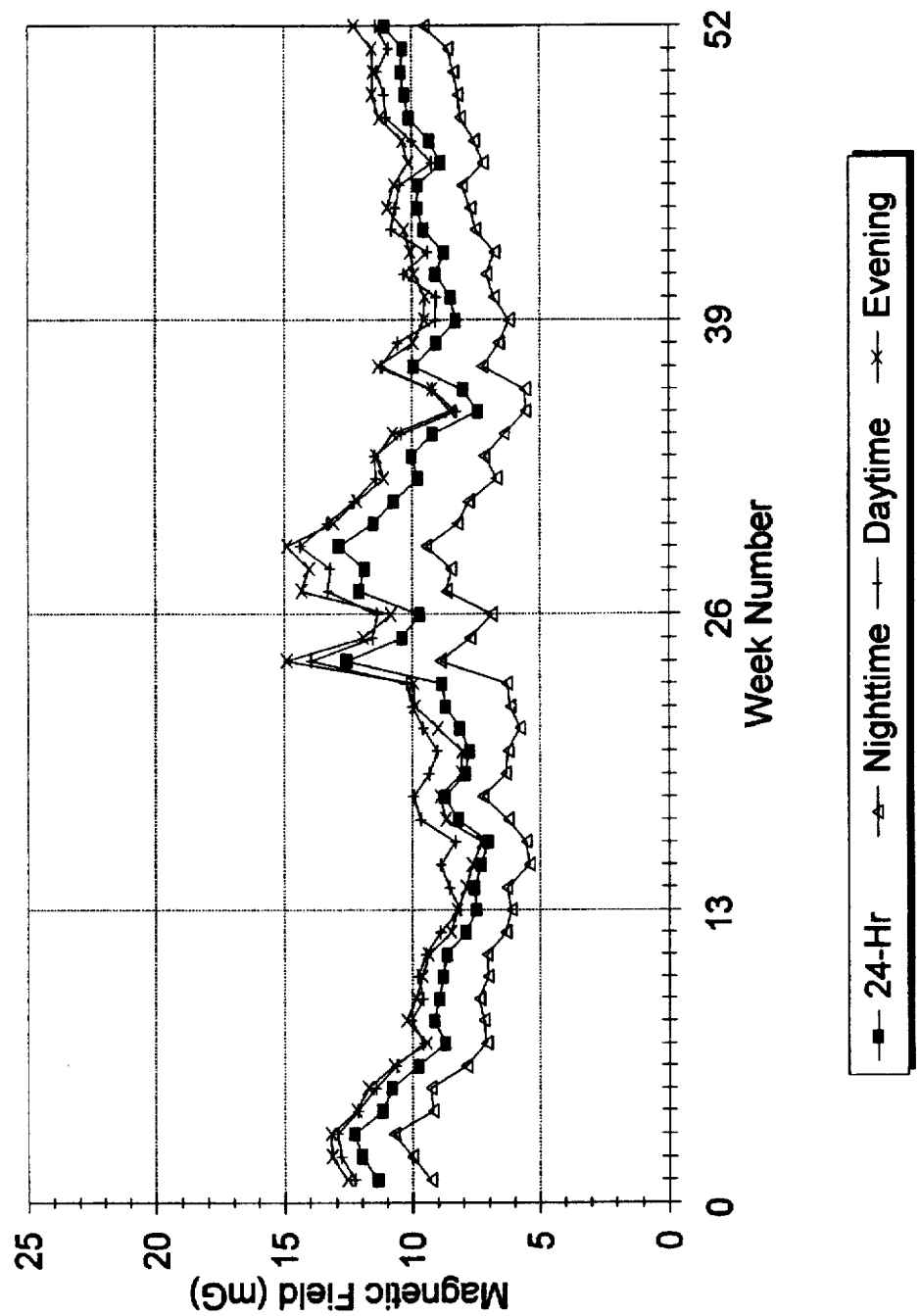

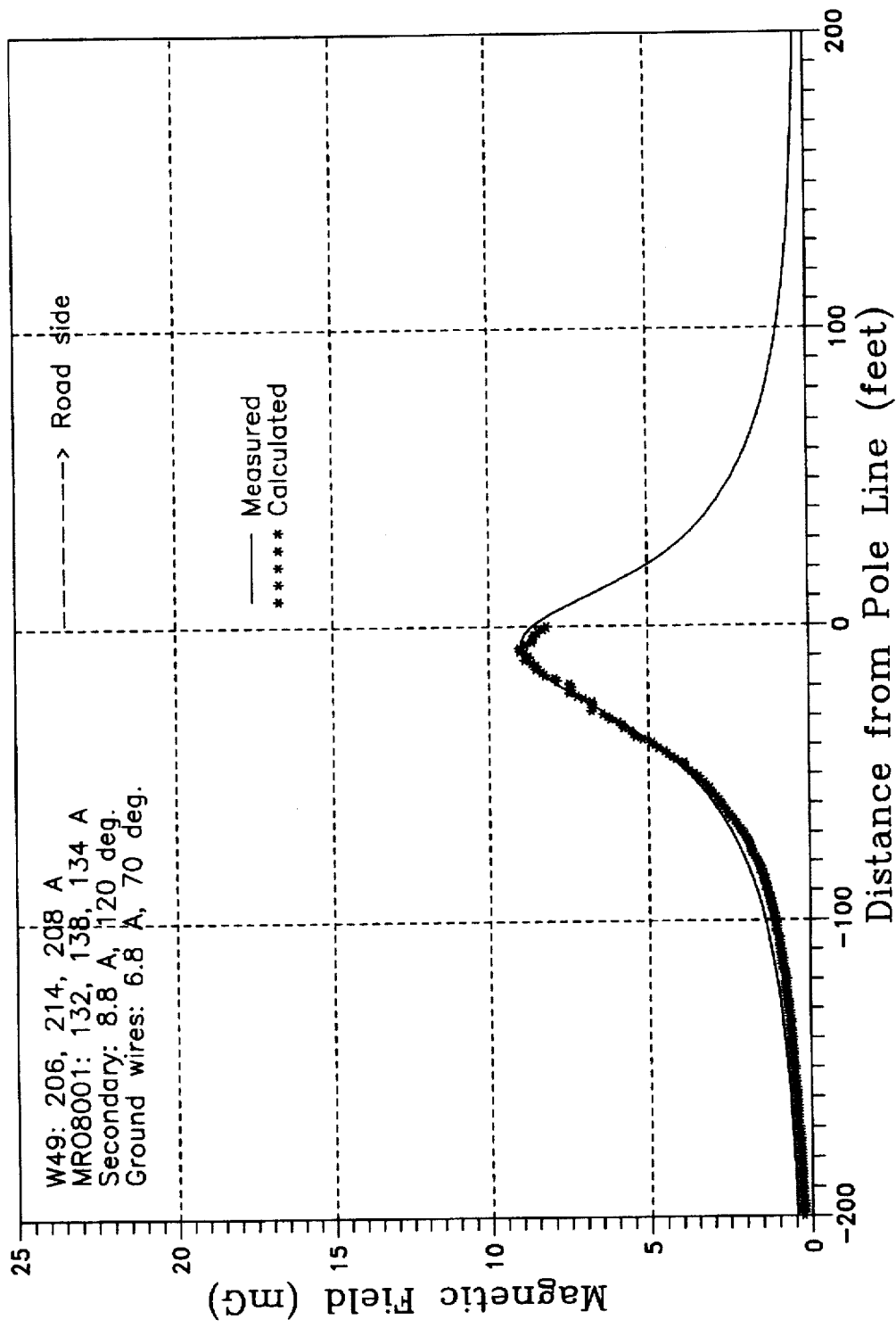

Fig. 9 - Table 1
Magnetic Field Levels - Average Means - Daily and Weekly Periods
(Levels in milligauss)

| Weekly periods | Daily periods | Site number | | | | | |
|---|---|---|---|---|---|---|---|
| | | 1 | 2 | 3 | 4 | 5 | 6 |
| All week | 24-hr | 4.1 | 9.6 | 9.0 | 3.9 | 11.8 | 1.1 |
| Weekday | 24-hr | 4.3 | 9.9 | 9.3 | 4.0 | 11.9 | 1.2 |
| Weekend | 24-hr | 3.7 | 8.8 | 8.2 | 3.6 | 11.5 | 1.0 |
| All week | Night | 3.3 | 7.4 | 7.4 | 3.1 | 9.4 | 0.9 |
| Weekday | Night | 3.3 | 7.5 | 7.5 | 3.2 | 9.5 | 0.9 |
| Weekend | Night | 3.2 | 7.2 | 7.2 | 3.0 | 9.2 | 0.9 |
| All week | Day | 4.7 | 10.6 | 9.8 | 4.1 | 12.8 | 1.3 |
| Weekday | Day | 5.0 | 11.2 | 10.3 | 4.3 | 13.1 | 1.3 |
| Weekend | Day | 4.0 | 9.3 | 8.4 | 3.6 | 12.1 | 1.1 |
| All week | Evening | 4.4 | 10.6 | 9.7 | 4.4 | 13.3 | 1.3 |
| Weekday | Evening | 4.6 | 10.9 | 10.0 | 4.5 | 13.3 | 1.3 |
| Weekend | Evening | 3.9 | 10.0 | 9.1 | 4.2 | 13.3 | 1.2 |

Fig. 10 - Table 2
Magnetic Field Levels - Average Means - Daily and Seasonal Periods
(Levels in milligauss)

| Seasonal periods | Daily periods | Site number | | | | | |
|---|---|---|---|---|---|---|---|
| | | 1 | 2 | 3 | 4 | 5 | 6 |
| Q1 | 24-hr | 4.3 | 9.8 | 9.4 | 4.0 | 12.4 | 1.2 |
| Q2 | 24-hr | 3.9 | 8.7 | 8.7 | 3.5 | 11.1 | 1.1 |
| Q3 | 24-hr | 4.3 | 10.1 | 9.3 | 4.3 | 14.0 | 1.2 |
| Q4 | 24-hr | 4.0 | 9.6 | 8.4 | 3.7 | 11.0 | 1.0 |
| Q1 | Night | 3.6 | 8.1 | 7.9 | 3.5 | 10.3 | 1.0 |
| Q2 | Night | 3.0 | 6.6 | 7.2 | 2.8 | 8.6 | 0.8 |
| Q3 | Night | 3.1 | 7.3 | 7.5 | 3.2 | 10.2 | 0.9 |
| Q4 | Night | 3.3 | 7.7 | 7.0 | 3.0 | 8.9 | 0.8 |
| Q1 | Day | 4.6 | 10.6 | 10.2 | 4.1 | 13.1 | 1.3 |
| Q2 | Day | 4.7 | 10.0 | 9.6 | 3.9 | 12.4 | 1.3 |
| Q3 | Day | 5.2 | 11.4 | 10.3 | 4.6 | 15.4 | 1.4 |
| Q4 | Day | 4.3 | 10.3 | 8.8 | 3.8 | 11.5 | 1.0 |
| Q1 | Evening | 4.6 | 10.7 | 10.1 | 4.4 | 13.7 | 1.4 |
| Q2 | Evening | 4.0 | 9.5 | 9.2 | 4.0 | 12.4 | 1.2 |
| Q3 | Evening | 4.5 | 11.6 | 10.1 | 5.0 | 16.2 | 1.4 |
| Q4 | Evening | 4.4 | 10.7 | 9.4 | 4.1 | 12.6 | 1.2 |

Fig. 11 - Table 3
Magnetic Field Levels - Average Percentiles - Weekly Periods
(Levels in milligauss)

| Weekly periods | Site | Average percentiles for 24-hr data | | | | | | | Max. |
|---|---|---|---|---|---|---|---|---|---|
| | | 0% | 5% | 25% | 50% | 75% | 95% | 100% | |
| All week | 1 | 3.0 | 3.2 | 3.7 | 4.1 | 4.5 | 4.9 | 5.3 | 10.0 |
| | 2 | 8.0 | 8.2 | 8.9 | 9.5 | 10.1 | 10.8 | 11.3 | 19.4 |
| | 3 | 7.7 | 7.9 | 8.4 | 8.9 | 9.4 | 10.0 | 10.4 | 24.2 |
| | 4 | 3.2 | 3.3 | 3.6 | 3.9 | 4.1 | 4.5 | 4.6 | 9.3 |
| | 5 | 10.0 | 10.2 | 11.0 | 11.7 | 12.5 | 13.4 | 13.9 | 25.6 |
| | 6 | 0.8 | 0.9 | 1.0 | 1.1 | 1.2 | 1.4 | 1.5 | 2.8 |
| Weekday | 1 | 3.2 | 3.3 | 3.9 | 4.3 | 4.7 | 5.2 | 5.5 | 10.0 |
| | 2 | 8.2 | 8.4 | 9.2 | 9.8 | 10.4 | 11.2 | 11.7 | 19.4 |
| | 3 | 7.9 | 8.1 | 8.7 | 9.2 | 9.7 | 10.4 | 10.8 | 22.9 |
| | 4 | 3.2 | 3.4 | 3.7 | 4.0 | 4.3 | 4.6 | 4.8 | 9.3 |
| | 5 | 10.0 | 10.3 | 11.1 | 11.8 | 12.6 | 13.6 | 14.2 | 25.6 |
| | 6 | 0.8 | 0.9 | 1.0 | 1.2 | 1.3 | 1.4 | 1.6 | 2.8 |
| Weekend | 1 | 2.7 | 2.9 | 3.3 | 3.7 | 4.0 | 4.4 | 4.8 | 8.6 |
| | 2 | 7.3 | 7.5 | 8.2 | 8.8 | 9.4 | 9.9 | 10.3 | 17.8 |
| | 3 | 7.2 | 7.3 | 7.8 | 8.2 | 8.6 | 9.1 | 9.4 | 24.2 |
| | 4 | 3.0 | 3.1 | 3.3 | 3.6 | 3.9 | 4.1 | 4.2 | 7.9 |
| | 5 | 9.7 | 9.9 | 10.7 | 11.5 | 12.2 | 12.9 | 13.3 | 24.9 |
| | 6 | 0.7 | 0.8 | 0.9 | 1.0 | 1.2 | 1.3 | 1.4 | 2.5 |

Fig. 12 - Table 4
Normalized Average Means - Daily and Weekly Periods
(Normalized to average mean at each site, in percent, c.f. Fig. 9)

| Weekly periods | Daily periods | Site number | | | | | | Average (sites 1 to 5) |
|---|---|---|---|---|---|---|---|---|
| | | 1 | 2 | 3 | 4 | 5 | 6 | |
| All week | 24-hr | 100 | 100 | 100 | 100 | 100 | 100 | 100 |
| Weekday | 24-hr | 104 | 103 | 103 | 103 | 101 | 104 | 103 |
| Weekend | 24-hr | 89 | 92 | 92 | 93 | 98 | 92 | 93 |
| All week | Night | 79 | 78 | 83 | 80 | 79 | 77 | 80 |
| Weekday | Night | 80 | 79 | 84 | 81 | 80 | 78 | 81 |
| Weekend | Night | 78 | 75 | 80 | 78 | 78 | 75 | 78 |
| All week | Day | 114 | 111 | 109 | 106 | 108 | 111 | 110 |
| Weekday | Day | 121 | 117 | 115 | 112 | 111 | 116 | 115 |
| Weekend | Day | 96 | 97 | 94 | 93 | 102 | 97 | 97 |
| All week | Evening | 107 | 111 | 108 | 113 | 112 | 113 | 111 |
| Weekday | Evening | 112 | 114 | 111 | 116 | 112 | 118 | 113 |
| Weekend | Evening | 94 | 105 | 102 | 107 | 113 | 104 | 104 |

Fig. 13 - Table 5
Normalized Average Means - Daily and Seasonal Periods
(Normalized to average mean at each site, in percent, c.f. Fig. 10)

| Seasonal periods | Daily periods | Site number | | | | | | Average (sites 1 to 5) |
|---|---|---|---|---|---|---|---|---|
| | | 1 | 2 | 3 | 4 | 5 | 6 | |
| Q1 | 24-hr | 103 | 102 | 105 | 103 | 105 | 106 | 104 |
| Q2 | 24-hr | 95 | 91 | 97 | 91 | 94 | 96 | 94 |
| Q3 | 24-hr | 103 | 105 | 104 | 110 | 118 | 110 | 108 |
| Q4 | 24-hr | 97 | 100 | 94 | 94 | 93 | 89 | 96 |
| Q1 | Night | 86 | 84 | 88 | 89 | 87 | 86 | 87 |
| Q2 | Night | 74 | 69 | 81 | 72 | 73 | 72 | 74 |
| Q3 | Night | 76 | 76 | 84 | 83 | 87 | 81 | 81 |
| Q4 | Night | 79 | 81 | 78 | 77 | 75 | 68 | 78 |
| Q1 | Day | 111 | 111 | 114 | 106 | 111 | 112 | 111 |
| Q2 | Day | 113 | 105 | 107 | 99 | 105 | 112 | 106 |
| Q3 | Day | 126 | 119 | 115 | 118 | 131 | 126 | 122 |
| Q4 | Day | 103 | 108 | 98 | 99 | 98 | 92 | 101 |
| Q1 | Evening | 112 | 112 | 113 | 114 | 116 | 120 | 113 |
| Q2 | Evening | 98 | 99 | 102 | 102 | 105 | 104 | 101 |
| Q3 | Evening | 108 | 121 | 113 | 128 | 137 | 123 | 121 |
| Q4 | Evening | 108 | 112 | 105 | 106 | 107 | 105 | 107 |

Fig. 14 - Table 6
Normalized Average Percentiles - Weekly Periods
(Normalized to average medians at each site, in percent, c.f. Fig. 11)

| Weekly periods | Site number | Normalized average percentiles for 24-hr data | | | | | | | Max. |
|---|---|---|---|---|---|---|---|---|---|
| | | 0% | 5% | 25% | 50% | 75% | 95% | 100% | |
| All week | 1 | 74 | 78 | 90 | 100 | 109 | 120 | 129 | 243 |
| | 2 | 84 | 86 | 94 | 100 | 106 | 114 | 118 | 204 |
| | 3 | 87 | 89 | 95 | 100 | 106 | 113 | 117 | 272 |
| | 4 | 82 | 85 | 93 | 100 | 107 | 115 | 119 | 241 |
| | 5 | 85 | 87 | 94 | 100 | 107 | 115 | 119 | 219 |
| | 6 | 71 | 76 | 89 | 100 | 111 | 124 | 135 | 251 |
| | Avg. (1-5) | 82 | 85 | 93 | 100 | 107 | 115 | 121 | 236 |
| Weekday | 1 | 77 | 81 | 95 | 105 | 114 | 126 | 135 | 243 |
| | 2 | 86 | 89 | 97 | 103 | 109 | 117 | 123 | 204 |
| | 3 | 89 | 92 | 98 | 103 | 109 | 117 | 122 | 257 |
| | 4 | 84 | 87 | 96 | 103 | 110 | 119 | 123 | 241 |
| | 5 | 86 | 88 | 95 | 101 | 108 | 117 | 121 | 219 |
| | 6 | 75 | 79 | 92 | 103 | 114 | 128 | 139 | 251 |
| | Avg. (1-5) | 84 | 87 | 96 | 103 | 110 | 119 | 125 | 233 |
| Weekend | 1 | 66 | 70 | 81 | 89 | 98 | 108 | 116 | 210 |
| | 2 | 77 | 79 | 87 | 93 | 98 | 104 | 108 | 187 |
| | 3 | 81 | 82 | 87 | 93 | 97 | 102 | 105 | 272 |
| | 4 | 77 | 79 | 86 | 93 | 100 | 106 | 110 | 203 |
| | 5 | 83 | 85 | 92 | 98 | 104 | 111 | 114 | 213 |
| | 6 | 63 | 68 | 81 | 92 | 103 | 116 | 127 | 226 |
| | Avg. (1-5) | 77 | 79 | 86 | 93 | 99 | 106 | 111 | 217 |

… continued.

METHOD FOR LONG TERM MONITORING OF MAGNETIC FIELDS

FIELD OF THE INVENTION

This invention relates generally to a methodology for monitoring the strength of magnetic fields and one particularly suitable for long term monitoring of such fields.

BACKGROUND OF THE INVENTION

Power lines generally can be classified into transmission lines and distribution lines. For transmission lines, line current flows are relatively well defined. As a result, attending magnetic fields are essentially predictable.

Distribution lines are a different story. These lines emanate, typically, at a power company's substation. They provide the electric power to the community with its varying needs, depending on the mix of commercial and retail accounts; the day of the week; time of the day; season; etc. Phase current imbalances, neutral return currents, underground or overhead conductors, in various configurations etc., all contribute to the lack of consistency in the strength of fields these type of lines produce.

Nowadays, with alleged concerns about possible health consequences resulting from magnetic fields, it becomes important for power utility companies to ascertain the strength of fields in the vicinity of distribution lines on both a spot measurement basis, and perhaps, more importantly, over extended periods.

Various short term or spot measurement techniques near distribution lines have been utilized. Some are reported. E.g. see Paul Herouix's paper entitled "60 HZ Electric and Magnetic Fields Generated by a Distribution Network" appearing in Bioelectromagnetics, in 1987, at Vol. 8, pp 135-148.

Such spot measurements are of relatively short duration and usually are performed under circumstances where environmental conditions are favorable and easily predictable. Equipment that is used is typically battery powered since the deleterious effects of time on the performance of batteries is irrelevant. Operators are usually present for each reading. Magnetic field readings and corresponding measurement locations are recorded on data sheets suitable for the purpose.

Attempts at determining magnetic field strengths over the long term have focused on making spot measurements of the magnetic field along a line transverse to the path of a distribution line. This is done for a significant number of measured current levels in the different power lines. Evaluations of this data have confirmed that there is good correlation between the calculated and measured magnetic fields. By developing a load current history throughout the year and over a period of years, the resulting magnetic fields over the same period of time can be estimated. (See T. Vinh et al's paper, "Magnetic Fields Near Overhead Distribution Lines-Measurements and Estimating Technique" appearing in the IEEE Transactions on Power Delivery, Vol. 6, No. 2, April 1991). However, these are estimated results and thus subject, in fact, to perhaps significant deviations from actual values. A concerned public may not easily be persuaded of their accuracy.

Similar concerns as to the long term effects of magnetic fields attributable to a.c. electric power, and associated harmonics, can exist in the work place. Machinery utilizing high a.c. currents may have significantly higher magnetic fields. Certain types of machinery, e.g. an electric arc furnace, can be a "rich" generative source of magnetic fields attributable to the a.c. currents utilized-with both fundamental and harmonic content present. In view of OSHA concerns for worker safety, field strength data over a protracted period is informative and thus important.

It is therefore a primary object of this invention to provide a methodology which ensures an accurate depiction of the actual magnetic field strengths attributable to a.c. electric current over an extended period of time.

It is a further object of this invention to provide a methodology which performs accurately in the presence of various environmental conditions.

It is still an object of this invention to provide a methodology which relies on the a.c. power it is measuring to sustain its operability over the test interval.

Yet another object of this invention is to include in the methodology a step which provides for the storage of data so that direct human access to the monitoring equipment is minimized and can be eliminated except to make repairs on the equipment.

It is still a further object of this invention to provide a method for measuring magnetic fields associated with a.c. currents of fundamental frequency and attending harmonics, as well as transients.

SUMMARY OF THE INVENTION

Towards the accomplishment of these and still other objects which will become more apparent from a reading of the following description and attending drawings, there is described a method for measuring the magnetic field strengths of a.c. electrical currents. Applications include the measuring of fields associated with a.c. utility power distribution lines. The invention seeks to determine the magnetic field strengths at a particular location over a protracted period of time. The invention disclosed calls for the placement of a field monitoring instrument at the intended location. The instrument is adapted to measure the magnetic field strengths of both fundamental and harmonic components as desired, at various times over the protracted period.

Where environmental concerns exist, the instrument is placed in an enclosure which is adapted to protect the measuring instrument from the weather elements of the associated environment. In this circumstance, the enclosure is fabricated from materials which will not affect the strength of the magnetic fields as would otherwise be detected by the instrument if not placed in the enclosure.

Since the invention is directed to ascertaining long term, magnetic field strengths, the invention disclosed provides for the powering of the monitoring instrument from a source of d.c. electrical power which, typically, is uninterruptable. In the circumstance where the effects of current in a.c. power lines are being monitored, means for converting the a.c. electrical power into the d.c. electrical power necessary to power the monitoring instrument are derived, via a.c. to d.c. conversion means, from the a.c. power that is being monitored. In order to avoid "contamination" by said conversion means, the latter is placed at a distance, sufficiently far from the monitoring instrument so as not to affect the magnetic field strength readings being taken.

The methodology calls for performing periodic (as may be required) gross functionality checks to confirm the operability of the field monitoring equipment. The magnetic field strength readings are taken periodically throughout the test interval. The method disclosed includes storage of intermittent readings throughout the protracted period. Preferably, the monitoring instrument itself is of a type which includes a computer memory for such storage. Alternately, readings for the instrument can be communicated to a remote computer where the data is stored in a similar fashion. The storage of data, however accomplished, provides for subsequent analysis at an appropriately convenient time.

The methodology provides adapting a particular test site so that elements of the environment at the location do not adversely affect the performance of the monitoring equipment.

A further step is disclosed which provides for the down loading of stored data. The down loading of the data, can include a further step of an additional, down loading to a floppy disc for purposes of insuring a redundant or back-up copy of the data.

Yet another step in the methodology provides for taking data to establish the lateral profile of the magnetic field strengths transverse from the particular location at which the monitoring instrument is placed. This provides a method for extrapolating the data taken by the instrument, for distances along this transverse path, through a determination of the magnetic field drop off rates.

The methodology disclosed although preferably, as explained in this application, is used for determining long term, magnetic field strengths associated with a.c. power lines, has additional application to any circumstance, including work place situations, where the long term effects of magnetic fields associated with a.c. currents and associated harmonics are of interest or concern.

BRIEF DESCRIPTIONS OF THE DRAWINGS

FIGS. 4 through 7 are graphical depictions of magnetic field levels based on data taken at a typical test site.

FIG. 8 is a graphical depiction of a magnetic field, lateral profile taken at a typical site.

FIG. 9 through FIG. 14 depict in table format the compilation of data reflecting magnetic field levels at different sites for different periods and seasons.

DESCRIPTION OF THE PREFERRED EMBODIMENT

Figure 1:
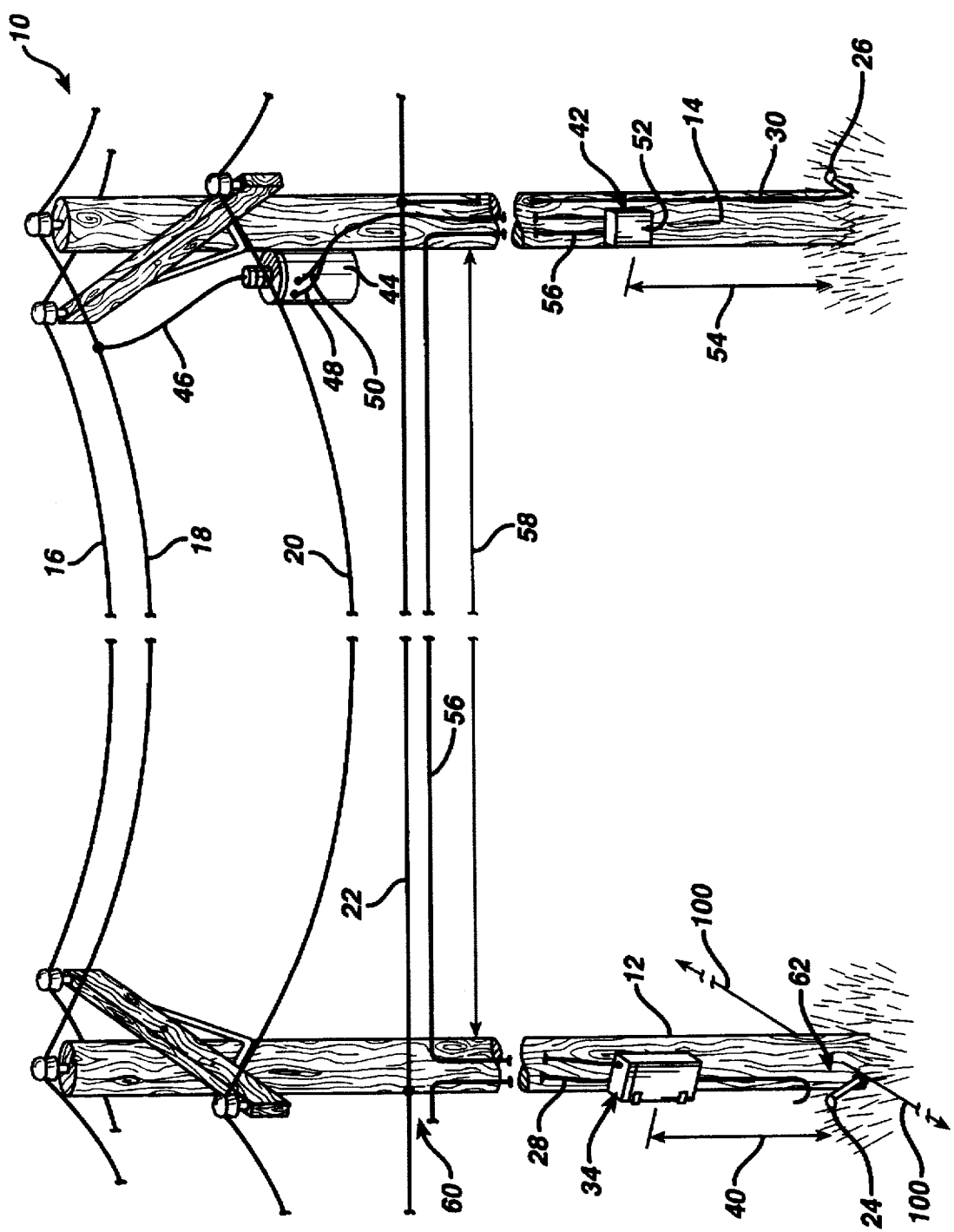
FIG. 1 is a perspective view of a landscape including a.c. power distribution lines on poles and the relative location of equipment necessary to implement the methodology of the present invention.

Referring now to FIG. 1, there is shown a typical segment 10 of an a.c. power distribution system comprising utility poles 12 and 14. For example, power lines 16, 18, and 20 would carry respective phases of a three (3) phase power distribution feeder line. A system includes a common neutral 22 strung between each pole. The common neutral is tied to ground rods 24 and 26 at each of the poles via lines 28 and 30. Depending on the power needs of the community served by the distribution lines, the electric currents flowing in lines 16, 18, 20, and in the common neutral 22, are essentially inclusive of a fundamental component, typically sixty (60) Hz, plus various harmonic components. This invention sets out a method and protocol for measuring the magnetic field strengths of the a.c. currents containing these fundamental and harmonic frequencies.

For purposes of implementing the methodology of the present invention, for outdoor applications, a magnetic field monitoring instrument 32 (FIG. 2) is positioned in enclosure 34 which is positioned on utility pole 12. A suitable monitoring instrument is the Field Star 1000, a multiple-function, hand-held recorder for logging magnetic fields. It includes three (3) orthogonal sensing coils which measure the magnitude of the magnetic field components along the x, y, and z axis. The instrument includes a data logger which can record magnetic field data as a function of time or distance.

The Field Star includes a self contained microcomputer. Software included in the instrument displays menu options on the alpha-numeric display, 36. Options are then selected using the key pad 38. Through the display, the self-contained microcomputer provides information to the operator as to what program has been selected, what data label has been entered, etc. This allows the Field Star, monitoring instrument to be operated almost entirely independently of a personal computer, except for data analyses, graphics and hard copies of the data.

In the display mode, the Field Star provides a real time, read-out of the three orthogonol vector components of the magnetic field and the resultant field magnitude. The instrument can time sample magnetic fields at sampling intervals of one second or any integer number of minutes from one to fifteen.

The enclosure 34 is positioned at a particular location 40, on the utility pole, which is approximately one meter above ground level. The enclosure 34 is positioned so that the meter 32 is in fact at one meter above ground level. The x-,y-, and z-coils of the meter 32 are respectively vertical, perpendicular and parallel to the power lines to be monitored, 16, 18, and 20.

The Field Star meter is manufactured by the Dexsil Corporation of Hamden, Connecticut. Field Star is a trademark of the Dexsil Corp. As purchased, the Field Star instrument is battery operated. Of necessity, the methodology of the present invention, since it is directed to recording field strengths over a protracted period of time, and preferably while the instrument is unattended, requires that a source of d.c. electrical power be provided which will power the instrument, without interruption, over that period of time.

For those purposes, the present invention provides for a sustainable d.c. electrical power source 42. In order that the d.c. electrical power source be sustainable, it is derived from the a.c. power lines being monitored. For example, the primary of a distribution transformer 44, taps off power line 18 via connecting line 46. The secondary of the distribution transformer 44 is supplied to the box 52 for converting to d.c. power via lines 48 and 50. The box 52 is positioned on utility pole 14 at a distance 54 which is approximately six feet above ground level. The d.c. voltage developed at source 42 is supplied via electrical line 56 to the enclosure 34 positioned on utility pole 12. The d.c. power source 42 is positioned on pole 14 which typically is located a sufficient distance from pole 12 so that the conversion of a.c. to d.c. power does not give rise to unwanted a.c. current sources, and associated fields, in proximity to the monitoring instrument 32. In a typical installation, the distance 58 would be on the order of one hundred and thirty feet.

The box 52 as noted earlier, is approximately six feet above ground level. This would facilitate servicing of the box as required. The d.c. voltage on line 56 represents the output voltage of a bridge rectifier circuit. For a hundred and twenty volt a.c. input on lines 48, 50, the raw d.c. voltage on line 56 would be approximately one hundred sixty-seven volts d.c. The d.c. voltage when it arrives at enclosure 34 is internally distributed through fuses.

In order to further avoid unwanted a.c. currents in the vicinity of enclosure 34, ground wire 28 is disconnected from the common neutral 22, at points 60 and 62. This does not significantly impair the function of grounding the common neutral line 22 since the remaining poles in the distribution system, of course, retain their grounding wires such as line 30 on pole 14.

Figure 2:
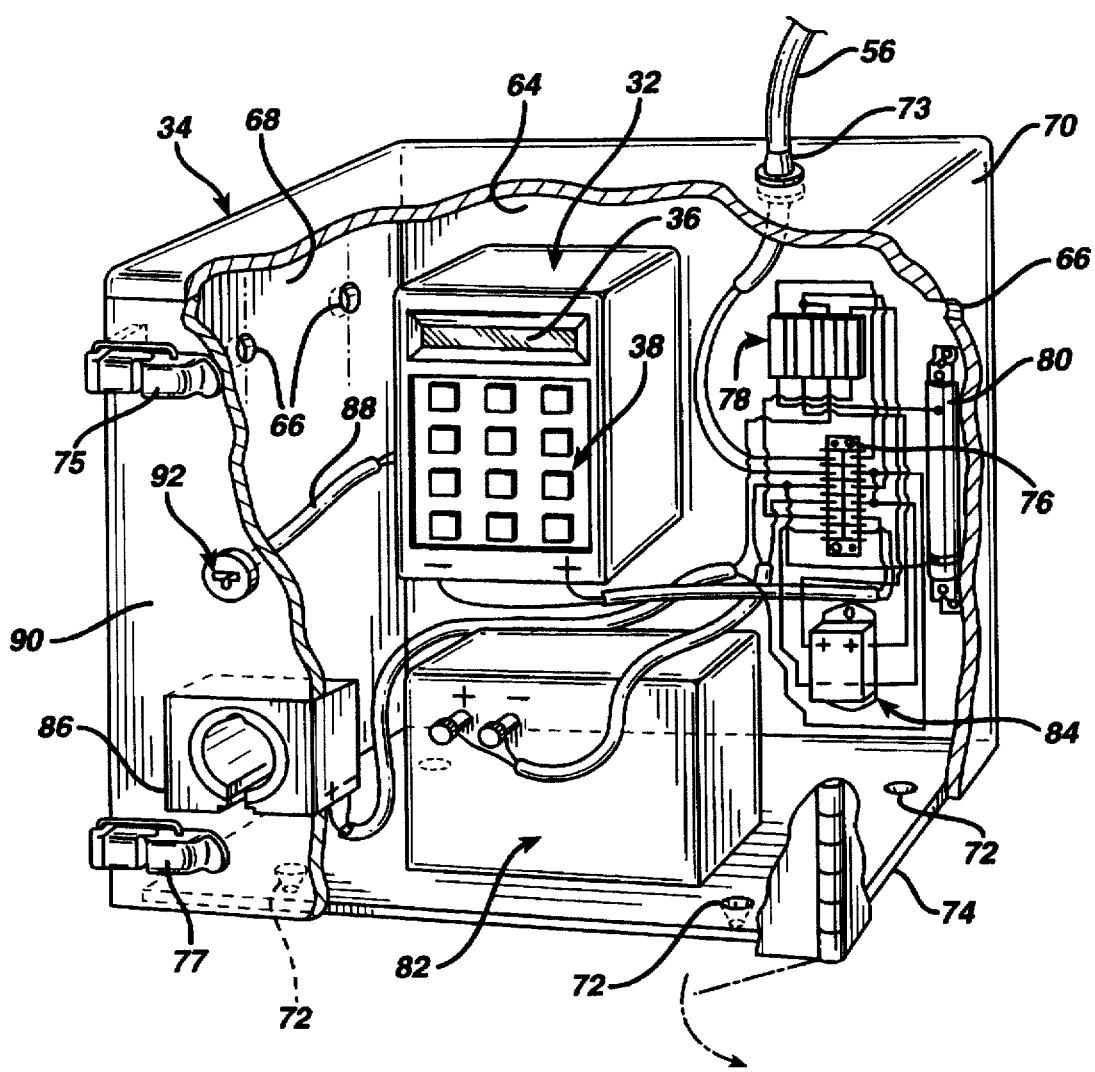
FIG. 2 is a perspective view of the enclosure used in the invention, broken away in part, to review the components used to accomplish the purposes of the invention.

Referring to FIG. 2, the enclosure 34 in a partial, sectional perspective view, reveals the interior of the enclosure 34. The enclosure itself is fabricated from weather proof material, such as fiberglass. Importantly, the material selected not only for the enclosure but for the other components used should have minimal, if any, effect on the strength of the magnetic fields to be monitored by the instrument 32. Again, fiberglass is suitable in this respect. Cable fittings connecting various electrical lines to the enclosure will typically be liquid tight. Seals and gaskets, as necessary, are utilized.

An enclosure that has been found suitable for the application of the present invention is manufactured by the Hoffmann Engineering Company of Anoka, Minn. The enclosure includes lockable, quick release latches, 75 and 77, which permit easy access to the interior. This style enclosure is suitable not only for locations outdoors, but in corrosive or high security environments, indoors or outdoors, over a broad range of possible applications.

The instrument 32 is positioned on the back wall 64 of the enclosure. The position on the back wall is such that when the enclosure 34 is mounted on the pole 12, the instrument, as noted above, would be at a distance 40 of one meter above ground level. Also, as noted above, the meter's position is such that the x-, y- and z coils of the instrument are respectively vertical, perpendicular and parallel to the power lines when the enclosure 34 is mounted on the pole 12. Holes 66, 3/32" in diameter, are located in the side walls 68 and 70 of the enclosure. They are drilled at a downward 45 degree angle, as seen from the interior of the enclosure. These permit moisture release from the interior and inhibit infiltration of rain water and insects. Holes 72 in the base portion 74 drain off accumulated water, due to condensation or minimal seepage, if any.

The d.c. power provided by source 42 arrives at the enclosure on line 56, which enters the enclosure through a liquid-tight, non-metallic strain relief connector, 73.

The power on line 56 is first directed to a barrier terminal block 76 from which it is distributed through a one amp fuse, in amp block 78, to power resistor 80. The other side of resistor 80 is connected to a twelve volt battery, 82. The heat generated by the power resistor warms the enclosure during the winter and minimizes internal condensation, thus keeping the environment within the enclosure 34 suitable for year-round performance of the instrument 32. A suitable resistor is a nine hundred ohm ceramic power resistor.

The twelve volt d.c. clamp at the battery is distributed through a one amp fuse in fuse block 78 to a voltage regulator 84. It is also distributed through a ten amp fuse to an outlet 86 to be utilized during gross functionality checks as required and as described below.

The battery found fitting for this application is a twelve volt, four amp-hour, sealed lead acid maintenance free battery suitable for electronic back-up type applications. Type number, NP 4-12, manufactured by YUASA/EXIDE, INC., has been found suitable. The battery provides a relatively fixed supply voltage for the voltage regulator 84 and, of course, necessary power when the equipment at the location is being serviced and it is required to disconnect from the line 56; or during intermittent a.c. power interruptions.

The voltage regulator 84 reduces the twelve volt d.c. input to nine volts d.c. which is supplied through a one amp fuse to the metering device, 32. The voltage regulator buffers the meter from transients and provides an uninterruptable power supply as noted above.

Cable 88 connects the data output terminal (not shown) on instrument 32 to the face panel 90 of enclosure 34. The cable 88 terminates in a suitable connector 92, e.g. a standard RT 11 phone jack which will permit access to the data output terminal of the meter for on-site, down loading at periodic intervals. Alternately, or in parallel, the data on the output terminal of the meter can be remotely accessed, periodically, over telephone lines; or via a suitable radio transmission device (not shown) which can also be included in the enclosure. This would reduce the need for on-site visits to equipment calibration and repair, as required.

Figure 3:
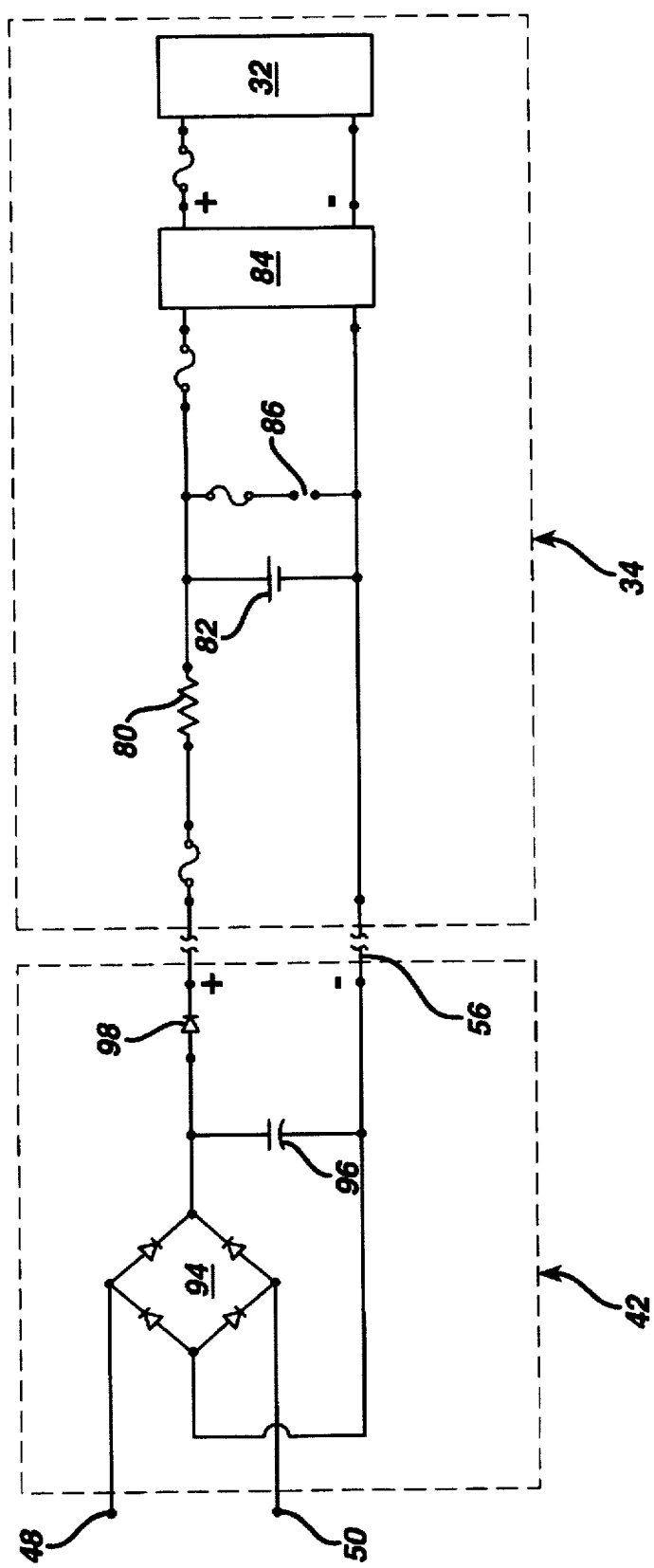
FIG. 3 is an electrical schematic of circuitry used to accomplish the purposes of the invention.

Enclosure 42 on utility pole 14 provides a source of d.c. electrical power as noted above. FIG. 3 schematically depicts the typical contents of enclosure 42. One hundred and twenty volts a.c. is received on lines 48 and 50. These are supplied to opposite ends of a typical diode bridge circuit 94. A suitable silicon bridge rectifier circuit is manufactured by the Fagor Company of Andover, Mass. Their type number FB 5002, handling an average rectified forward current of fifty amps, has been found suitable. Filter capacitor 96 is placed across the d.c. voltage output of the rectifier bridge circuit 94. Filter capacitor 96 would have a typical value of four hundred seventy microfarads and sufficient d.c. voltage rating to handle a rectified, one hundred twenty volt a.c. line voltage. Part number, 80D-471P200KT5, made by the Sprague Company of Sanford, Me., is a suitable type for this application. Diode 98 connects the high side of the filter capacitor to the output where one hundred sixty-seven volts d.c. appears.

As noted above, a built in outlet 86 is provided which brings twelve volts d.c. to the face panel 90. This typically could be a cigarette lighter outlet and is used principally to power up a magnetic field generator useful in checking the functioning of instrument 32.

For a particular "non-metallic" enclosure design, it is important, at least initially, to check the effects of the enclosure and its components on magnetic fields as sensed by the monitoring instrument, 32. This is accomplished in the present invention by employing a one-meter square, magnetic field generating test loop. In a location which has an imperceptible field effect on the instrument 32 standing alone, the enclosure, including the instrument and supporting components, is positioned in the center of the energized test loop of known magnetic field strength. The instrument reading is noted. It has been demonstrated that the non-metallic enclosure design of the present invention has no effect on the applied magnetic field.

Periodically, it is important to check the operability of equipment at the site, particularly the monitoring instrument 32. This typically might occur after downloading of data and before storing data for the next monitoring period. A typical magnetic field generator found useful in this regard is model 147 manufactured by the Electric Field Measurements Company, of West Stockbridge, Mass. The generator obtains the necessary a.c. power to generate the calibrating fields from a d.c. to a.c. converter, not shown, which is connected to the twelve volt d.c. outlet 86 on the enclosure face plate 90. The field generator is designed to check for gross errors in the functioning of the instrument 32. The generator loop of the field generator is aligned, successively, with each of the coils of the monitoring instrument 32. To the extent, again, gross correlation exists, the equipment is assumed to be satisfactorily operating. Further, the readings of a first meter 32 can be compared against those indicated by a spare meter so as to confirm the continued stability of the first monitoring instrument, 32. Once the stability of the monitoring instrument 32 is confirmed the intervals between calibrations can be extended.

The method of the present invention calls for accessing the information stored in the instrument 32 periodically. This interval, again, can be extended as the reliability of the monitoring instrument is established. So for example, in an application performed by the inventors, the protocol called for a retrieval of data once a week for an initial eight week period. The instrument 32 was checked for stability each time. Once the meter was confirmed as reliable, the interval to retrieve data was increased to once every four weeks. Although the data can be down loaded to a PC by an operator at the particular site, using jack 92, again, as noted earlier, the remote accessing of data can be accomplished via a telephone line hook up to the meter. Thus the enclosure permits implementation of the method of the present invention at a remote facility. Of course equipment reliability checks would be made periodically by on site visits but these can be minimized as time progresses.

In order to provide a redundant data source for subsequent analysis the present method allows for down loading readings stored in the instrument 32 directly to a PC for storage in the computer's memory; or onto a floppy disk for long term storage.

The method of the present invention further calls for the development of lateral profiles of the magnetic fields at varying distances along path 100, transverse to the direction of the power lines 16, 18, and 20. These profiles illustrate the magnetic field drop off rates with distance along path 100 from the enclosure 34. Another Field Star meter such as the meter 32 in enclosure 34 can be used. The Field Star meter includes a provision which allows readings to be made at various distance intervals. For purposes of the lateral profile, the method of the present invention calls for taking a field map reading every foot, for 200 feet in either direction, along path 100, at a height above ground equal to that of the instrument 32, namely one meter. In order to compare the measured profiles with calculated results, currents in the overhead lines 16, 18, and 20, and the common neutral 22, are detected by a suitable clamp-on ammeter. The lateral profiles are taken at periodic time intervals so as to allow for a study of the profiles for different seasonal loads. A typical interval has been every three months.

The above described methodology was implemented at six monitoring sites. Five of these monitored various overhead line configurations for 13, 26, and 69 kV power lines which typify standard utility overhead distribution schemes. The sixth site was near an electric distribution substation with a variety of a.c. voltage bus structures, circuit breakers, transformers, feeder rows with automatic switch gear and a control house.

Data was collected over a protracted period of time, at least fourteen months, at each site. In some cases data was collected for upwards of nineteen months. Of course, as required, for statistical purposes, with the methodology discussed herein, data can be collected for longer periods.

After a review of measured raw data for completeness and validity, (certain data is discarded based on the insufficiency of data points in a given period or because of obvious abnormalities) a format was developed for tabulating and graphically displaying the collected information. The format selected by the inventors reflects a utility company's interest in daily, weekly and seasonal usages.

The format included:
(1) four daily periods—(a) 24-hr. (11 pm to 11 pm); (b) Nighttime (11 pm to 7 am); (c) Daytime (7 am to 3 pm); and, (d) Evening (3 pm to 11 pm).
(2) three weekly periods—(a) All week (11 pm Sunday to 11 pm Sunday); (b) Weekdays (11 pm Sunday to 11 pm Friday with holidays falling on weekdays analyzed together with weekday data); and, (c) Weekends (11 pm Friday to 11 pm Sunday), and,
(3) five seasonal periods—(a) All year (weeks 1 to 52, where week one starts with the first Monday of each calendar year); (b) First quarter, Q1 (January to March, weeks 1–13); (c) Second quarter, Q2 (April to June, weeks 14–26); (d) Third quarter, Q3 (July to September, weeks 27–39); and (e) Fourth quarter Q4 (October to December, weeks 40 to 52).

For the inventors' application, data, typically, is recorded by the Field Star instrument 32, every fifteen minutes. Thirty two data points in each eight hour period (the smallest data set in the analyses) were used to construct a unique data vector with sixteen components: site number, year, week number, day of the week, month, day of the month, daily period, 0th percentile or minimum reading for the eight hour period, 5th percentile, 25th percentile, 50th percentile or median, 75th percentile, 95th percentile, 100th percentile or maximum, mean and variance. Subsequent analyses were carried out using these data vectors instead of the fifteen minute data points.

Since data collection periods at the sites ranged from fourteen months to nineteen months, of course, they were too short to permit a study of field variations by year. Instead, data vectors of selected data sets were averaged together regardless of the year. For example, a selected data set "Q1 weekday" contains all data vectors with the week number lying between one and thirteen and the day of the week between one and five, regardless of the year.

In the following tables and graphs, the terms "Average mean", "Average median", "Average Minimum", or "Average 0th percentile", "Average maximum or Average 100th percentile" and "Maximum" when and if used would have the following meanings:

(a) Average Mean—The arithmetic average of the means of all data vectors in a selected data set. Where all 32 data points were used to construct the vector, the average mean would be the same as the arithmetic average.

(b) Average Median—The arithmetic average of the medians of all data vectors in a selected data set. It is a good estimate for the median value of any eight hour period in the selected data set.

(c) Average Minimum or Average 0th percentile—The arithmetic average of the minimum of all data vectors in a selected data set.

(d) Average Maximum or Average 100th percentile—The arithmetic average of the maximum of all data vector in a selected data set.

(e) Maximum—The maximum of the maxima of all data vectors in a selected data set, which is the same as the maximum of the original data points that created the vectors.

Definitions for other average percentiles parallel those given for average minimum and average maximum.

Tables 1 and 2 give, respectively, average mean levels by daily, weekly, and seasonal periods, while Table 3 gives average percentiles for 24-hr, all week data. Table 4, 5, and 6 give normalized average mean levels for daily, weekly and seasonal periods.

FIGS. 4 through 7 are graphical depictions of magnetic field levels at one of the sites involved in the protocol of the present invention. The power line configuration at this site was a 26 kV delta and a 13 kV cross arm circuit, respectively at 50.5 and 31.5 feet above ground. At this site, as with the others, and as noted above, there are also overhead horizontal ground wires such as shield, neutral and telephone wires.

FIG. 8 plots the magnetic field lateral profile for site 2 on a particular day. The measured values compare well with the calculated valves based on the measured currents (see the upper left corner of the graph).

The operating experience with the methodology disclosed confirmed the approach. The results show that there were daily, weekly and seasonal cycles of magnetic fields. Normalized percentiles and means showed that the patterns, however, were similar at all sites. Variations in the methodology disclosed, of course, are possible and the description of the preferred approach is not to be construed as limiting. Rather the scope of the present invention is only to be limited by the breadth of the claims which follow.

What is claimed is:

1. A method for measuring the magnetic field strengths of a.c. electrical currents of a.c. power lines, at a particular location in relation to said a.c. power lines, and during a protracted period of time, without the presence of an operator for a substantial part of said period of time, comprising the steps of:

(a) positioning a magnetic field monitoring instrument at said particular location, said instrument adapted to measure the magnetic field strengths of the a.c. electrical currents at known times during said protracted period, said positioning including locating said instrument in an enclosure, said enclosure adapted to protect said instrument from the weather elements of the environment, said enclosure fabricated from materials which will not affect the strength of the magnetic fields as would be detected by said instrument if not placed in said enclosure;

(b) powering said monitoring instrument from a source of d.c. electrical power, so that the desired magnetic field strength readings can be produced and recorded, said source of d.c. electrical power including a source of a.c. electrical power and means for converting said a.c. electrical power into said d.c. electrical power, said means for converting placed at a distance sufficiently far from said monitoring instrument so as not to affect the magnetic field strength readings being taken, said enclosure including heater means, powered from said source of d.c. electrical power, for heating the interior of said enclosure;

(c) calibrating said magnetic field monitoring instrument, as required, during the protracted period of time;

(d) storing the desired magnetic field strength readings over, at least, a portion of the protracted period of time, said instrument including means for storing the desired magnetic field strength readings; and, (e) accessing the desired magnetic field strength readings periodically for subsequent analysis.

2. The method claimed in claim 1 wherein the desired magnetic field strength readings are stored over at least a portion of the protracted period of time by means which further permit said accessing.

3. The method claimed in claim 1 further comprising the step of checking, at least once, the electromagnetic effect of said enclosure on the magnetic field readings of said instruments.

4. The method claimed in claim 1 further comprising the additional step of determining the lateral profile of the magnetic field strengths, whereby the magnetic field drop off rates with distance from said particular location are determined.

5. The method claimed in claim 1 wherein the step of accessing is done from a location remote to said particular location.

6. The method claimed in claim 1 further comprising the step of checking the operability of said method for measuring said magnetic field strengths, as required, during the protracted period of time.

7. The method claimed in claim 6 wherein said instrument includes three mutually orthogonal coils for measuring the mutually orthogonal components of a desired magnetic field strength, wherein the step of checking the operability is effected by generating at least one field of known magnetic strength in respective, predetermined geometric relationships to each of said three coils of said instrument and confirming the expected readings.

8. The method claimed in claim 7 wherein the step of accessing includes accessing the stored readings and downloading the readings to a computer.

9. The method claimed in claim 8 further comprising the step of downloading the readings, a second time, to a floppy disk.

* * * * *